United States Patent
Rievers et al.

(10) Patent No.: US 9,083,281 B2
(45) Date of Patent: Jul. 14, 2015

(54) DC BLOCKER FOR A HIGH GAIN COMPLEX CIRCUIT

(71) Applicant: Dialog Semiconductor B.V., 's-Hertogenbosch (NL)

(72) Inventors: Soren Rievers, 's-Hertogenbosch (NL); Jan Geert Prummel, Eindhoven (NL)

(73) Assignee: Dialog Semiconductor B. V., 's-Hertogenbosch (NL)

( * ) Notice: Subject to any disclaimer, the term of this patent is extended or adjusted under 35 U.S.C. 154(b) by 17 days.

(21) Appl. No.: 13/957,763

(22) Filed: Aug. 2, 2013

(65) Prior Publication Data

US 2014/0266422 A1    Sep. 18, 2014

(30) Foreign Application Priority Data

Mar. 15, 2013   (EP) ..................................... 13159519

(51) Int. Cl.
H03F 1/00        (2006.01)
H03F 1/30        (2006.01)
H03F 3/189       (2006.01)

(52) U.S. Cl.
CPC .. *H03F 1/00* (2013.01); *H03F 1/30* (2013.01); *H03F 3/189* (2013.01); *H03F 2200/153* (2013.01)

(58) Field of Classification Search
CPC .................................................. H03F 2200/153
USPC ............................................. 330/97, 290, 2, 9
See application file for complete search history.

(56) References Cited

U.S. PATENT DOCUMENTS

| | | | |
|---|---|---|---|
| 4,872,209 A * | 10/1989 | Blanken | 330/294 |
| 6,606,359 B1 | 8/2003 | Nag et al. | |
| 7,403,760 B1 | 7/2008 | Gao | |
| 8,183,921 B1 | 5/2012 | Narayan et al. | |
| 2002/0037706 A1 | 3/2002 | Ichihara | |
| 2003/0214423 A1 | 11/2003 | Lee et al. | |

(Continued)

FOREIGN PATENT DOCUMENTS

JP    S55136712    10/1980

OTHER PUBLICATIONS

RF Microelectronics, Second Edition, by Behzad Razavi, Prentice Hall Communications Engineering and Emerging Technologies Series, Copyright Pearson Education, Inc. 2012, pp. 179-186, Theodore S. Rappaport, Series Editor.

(Continued)

*Primary Examiner* — Steven J Mottola
(74) *Attorney, Agent, or Firm* — Saile Ackerman LLC; Stephen B. Ackerman

(57) ABSTRACT

An amplifying circuit comprises an analog amplifying circuit having an analog input for receiving an analog input signal to be amplified and an analog output for outputting an amplified analog signal, wherein the amplifying circuit comprises an implementation of a complex transfer function. A feedback circuit has a feedback circuit input and a feedback circuit output, wherein the feedback circuit comprises an implementation of an inverse transfer function that is an estimation of an inverse of at least a DC component of the complex transfer function of the analog amplifying circuit. The feedback circuit input is arranged for receiving a signal that is based on the amplified analog signal of the analog amplifying circuit. The analog circuit is arranged for receiving a bias signal that is based on the feedback circuit output.

24 Claims, 5 Drawing Sheets

(56) References Cited

U.S. PATENT DOCUMENTS

| | | |
|---|---|---|
| 2005/0110550 A1 | 5/2005 | Shi et al. |
| 2005/0221763 A1 | 10/2005 | Song |
| 2006/0223472 A1 | 10/2006 | Bagchi et al. |
| 2009/0167577 A1 | 7/2009 | Juang et al. |
| 2012/0154032 A1 | 6/2012 | Lesso |

OTHER PUBLICATIONS

European Search Report 13159519.1-1810, Mailed: Sep. 16, 2013, Dialog Semiconductor B.V.

* cited by examiner

Provide an amplifier circuit comprising an analog amplifying circuit, having an analog input for receiving an analog input signal to be amplified, wherein the analog input may have a DC component, and an analog output for outputting an amplified analog signal, and a feedback circuit arranged for receiving a signal that is based on the amplified analog signal of the analog amplifying circuit and providing a bias signal, based on a feedback circuit output, to the input of the analog amplifying circuit —90

Implement a complex transfer function in the analog amplifying circuit, wherein the analog output of the analog amplifying circuit may have a DC component —91

Implement an inverse transfer function in the feedback circuit, wherein the inverse transfer function is correcting the DC component that may be present in the analog input by estimating an inverse of at least a DC component of the complex transfer function of the analog amplifying circuit —92

Adding the bias signal to the analog input signal to compensate the D component of the analog input signal —93

FIG. 9

DC BLOCKER FOR A HIGH GAIN COMPLEX CIRCUIT

FIELD OF THE INVENTION

The invention relates to an amplifier circuit with a DC blocker. More particularly, the invention relates to a DC blocker for use with an amplifier circuit.

BACKGROUND OF THE INVENTION

In the field of radio frequency (RF) receivers, an antenna signal may be amplified before it is fed into a detector element. The gain of the small antenna signal to the detector can be as much as 80 dB, or more. Direct current (DC) offset, caused by for example production tolerances of the elements of the receiver chain, if amplified by the same amount, could easily saturate the detector. Usually, this is avoided by amplifying the desired signal when its frequency is well above 0 Hz, while adding one or more DC blocking devices in the receive chain. A DC blocking device can be as simple as a first order high-pass filter (HPF).

Section 4.2.3 of "RF Microelectronics", by Behzad Razavi, second edition, Pearson Education, 2012, discloses a receiver architecture that uses a low intermediate frequency (LIF). This architecture allows a channel select filter to be integrated on-chip, while it still allows DC blocking to be achieved by one or more HPFs. Typically LIF receivers comprise a DC blocking devices deployed at a suitable location of an amplifier.

Herein above, aspects of receivers have been discussed. However, also other signal processing applications in which a large amount of gain is applied to a signal may benefit from some sort of DC offset compensation.

SUMMARY OF THE INVENTION

It is an object of the invention to provide an improved DC offset compensation for an amplifier circuit.

In a first aspect, the invention provides an amplifying circuit, comprising an analog amplifying circuit having an analog input for receiving an analog input signal to be amplified and an analog output for outputting an amplified analog signal, wherein the amplifying circuit comprises an implementation of a complex transfer function; and a feedback circuit having a feedback circuit input and a feedback circuit output, wherein the feedback circuit comprises an implementation of a transfer function, referred to hereinafter as inverse transfer function, that is an estimation of an inverse of at least a DC component of the complex transfer function of the analog amplifying circuit.

The feedback circuit input is arranged for receiving a signal that is based on the amplified analog signal of the analog amplifying circuit and the analog circuit is arranged for receiving a bias signal that is based on the feedback circuit output.

The feedback circuit, thanks to the implementation of the inverse transfer function of at least the DC component of the complex transfer function of the analog amplifying circuit, can provide a bias signal that corrects the DC component that may be present in the analog input. Also, the bias signal may correct a DC distortion of the amplified signal that may be caused by an imperfection of the amplifying circuit itself.

The feedback circuit may comprise an integrator for determining a DC component of an output of the implementation of the inverse transfer function based on the feedback circuit input, wherein the bias signal is correlated with the DC component. Using the integrator, the bias signal may converge to a fixed value in which the DC component effectively is compensated. The integrator may make the feedback circuit less sensitive to inaccuracies in its model of the inverse of the complex transfer function. Moreover, noise in the signal may be canceled out. The inverse transfer function may estimate the DC offset at the input based on a measurement at the output. The function of the integrator may be to let the system converge to the optimum solution gradually over time. This may help, for example, to compensate any error in the realization of the inverse transfer function.

The bias signal may be added to the analog input signal, to remove a DC component of the analog input signal. The bias signal may at least partly be a compensation of a DC component of the analog input signal.

The circuit may comprise at least one switch to enable the circuit to operate in at least a calibration mode and an operating mode, wherein, in the calibration mode, a connection between the analog input and an external signal source is disconnected, and the DC component of the analog input signal is estimated by the integrator, and a value representing that DC component is stored, and, in the operating mode, the bias signal is generated based on the stored value representing the DC component. These two modes allow the DC component to be estimated in a dedicated calibration mode, in which no signal is applied, but only the (distortive) DC is present. This allows the DC distortion to be estimated without being obscured by the analog input signal provided by the external signal source. This analog input signal usually is predominantly an alternate current (AC) signal. Moreover, once the value representing the DC component has been stored, it can be used to generate an appropriate bias signal without further power consumption by the feedback circuit.

The analog amplifying circuit may be configured to operate with increasing gain setting over time, during the calibration mode. This way, it is easier to let the feedback circuit converge. Moreover, different settings of the value representing the DC component may be determined and stored for different gain settings. The calibration phase can be split into two or more periods, with increasing gain settings for the amplifier. The feedback system may then continue to converge to the correct DC offset estimate. On the contrary, if a large gain setting, such as the highest gain setting, were selected initially, the unbiased or incorrectly biased DC component could clip the amplifier.

The analog circuit may have a number of processing portions connected in sequence. An output of the last portion in the sequence may be configured to provide the amplified analog signal to the feedback circuit, and the feedback circuit may be configured to provide separate feedback DC signals to inputs of at least two different portions of the sequence. This allows more sophisticated DC compensation by providing bias signals at different stages of the analog circuit. This allows to better compensating, for example, distortions caused by the analog circuit.

The circuit may be arranged to operate in at least two different calibration modes and an operating mode. Each calibration mode may be associated with a respective implementation of a transfer function, hereinafter referred to as respective inverse transfer function, that is an estimation of an inverse of at least a DC component of the complex transfer function realized by one or more sequential portions up to and including the portion in the sequence that provides the amplified analog signal to the feedback circuit. The bias signal may be provided to the first portion of the one or more sequential portions. This allows to determine, with a single signal being input to the feedback circuit, a plurality of bias signals to be applied to different portions of the analog amplifying circuit, based on a plurality of respective inverse transfer functions.

The analog circuit may comprise at least one intermediate frequency amplifier and an intermediate frequency filter. This is a suitable implementation of a feedback circuit for an amplifier with intermediate frequency architecture. The intermediate frequency may be a low intermediate frequency (LIF).

The analog circuit may comprise a heterodyne receiver configured to generate an intermediate frequency that is larger than 0 Hz and less than about 10 times a channel spacing of a received signal. This is a suitable application of the circuit including the feedback circuit.

The feedback circuit may comprise a digital circuit. This allows the feedback circuit to be implemented particularly efficiently. Moreover, the digital circuit may be relatively flexible regarding adaptation to a particular complex transfer function of an analog circuit. For example, the feedback circuit may be completely digital except for at least one analog-to-digital converter and at least one digital-to-analog converter.

The person skilled in the art will understand that the features described above may be combined in any way deemed useful.

BRIEF DESCRIPTION OF THE DRAWINGS

In the following, aspects of the invention will be elucidated by means of examples, with reference to the drawings. The drawings are diagrammatic and may not be drawn to scale.

FIG. 9 illustrates a flowchart of a method disclosed to provide an improved offset compensation for an amplifier circuit.

DETAILED DESCRIPTION OF EMBODIMENTS

Figure 1:
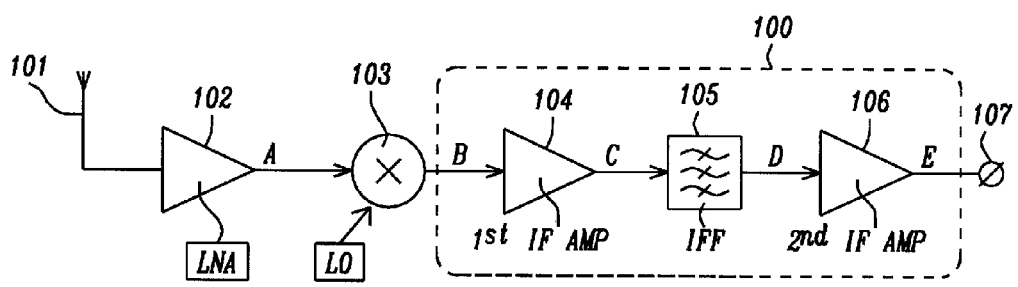
FIG. 1 prior art is a diagram of a low-intermediate frequency receiver.

FIG. 1 prior art shows an example of an intermediate-frequency amplifier circuit 100. A typical embodiment of a LIF receiver is conceptually given in FIG. 1 prior art, where any and all of the locations A through E can be a suitable location for a DC blocking device, depending on the individual gain factors of the amplifiers. The input of the circuit may be a signal received by an antenna 101. The antenna signal may first be amplified by a low noise amplifier (LNA) 102, to which the antenna is connected. This amplified signal (A) may be mixed with a local oscillator (LO) signal. This mixed signal B may be input to the intermediate-frequency (IF) amplifier circuit 100. The IF amplifier circuit 100 may comprise, in sequence, a first IF amplifier 104 producing signal C, an intermediate frequency filter (IFF) 105 producing signal D, and a second IF amplifier 106 producing the output signal E. Output signal E may be connected via connection 107 to further circuitry (not shown). In the following a DC suppression technique using a feedback circuit will be described. For example, a high-pass filter could be used to reduce a DC offset at location A, while the feedback circuit could be used to minimize the DC offset at point E by introducing a compensation signal at any or all of the points B, C and D. However, this is only an example. Alternatively, the feedback circuit described herein could also be used to provide a compensation signal at point A. In the latter case, preferably the bias signal is up converted by a mixer so that the bias signal provided to point A has the same frequency as the local oscillator LO.

Different high-pass filters may be used to reduce a DC component in an input signal. However, a first order high-pass filter may introduce a pole at a frequency which is lower than that of the desired signal, which makes the receiver system slow and in some cases difficult to stabilize. Two examples of common high-pass filters are shown in FIG. 2a prior art and FIG. 2b prior art.

Figure 2A:
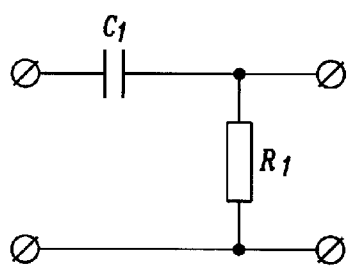
FIG. 2a prior art is a diagram of a high pass filter.

In the passive configuration shown in FIG. 2a prior art, the pole frequency may be determined by $$\omega_c = \frac{1}{R_1 C_1},$$

which is preferably small, and consequently either or both $R_1$ and $C_1$ are preferably large. Making only the resistor R1 large may have a noise penalty, making the capacitor C1 large may have an area penalty.

Figure 2B:
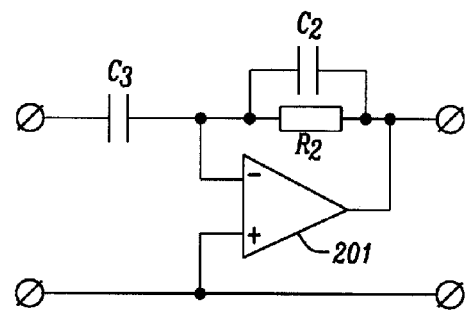
FIG. 2b prior art is another diagram of a high pass filter.

In the active implementation of FIG. 2b prior art, the pole frequency may be determined by $$\omega_c = \frac{1}{R_2 C_2}.$$

This active implementation may have several advantages over the passive implementation of FIG. 2a prior art. Making $R_2$ large does not have the corresponding noise penalty as in FIG. 2a prior art, and this implementation may allow gain in the pass band of the high-pass filter by appropriate choice of $C_3$. However, the operational amplifier 201 may increase the power consumption.

Figure 3:
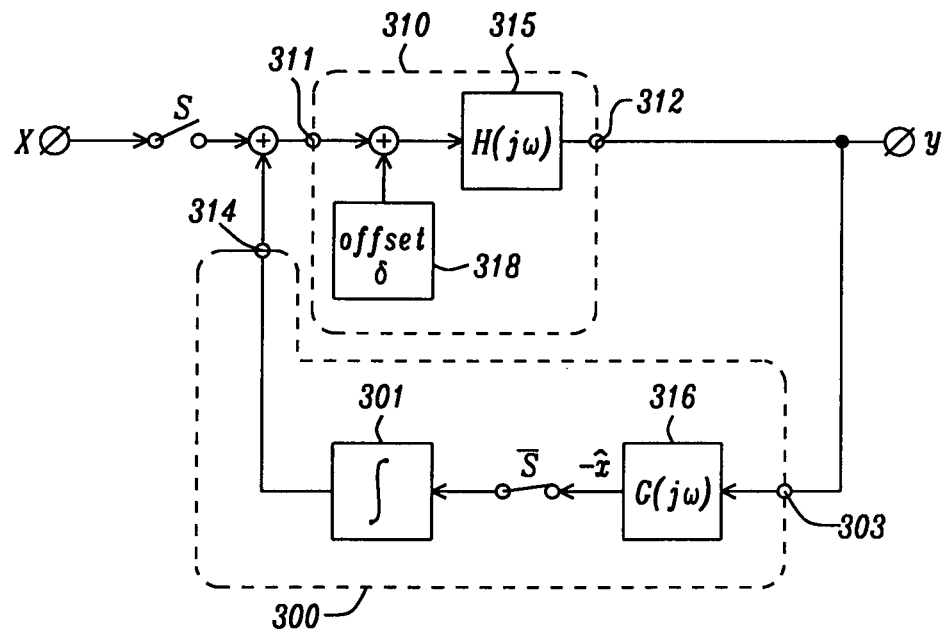
FIG. 3 is a diagram of a DC offset compensation depicted in capture mode.

FIG. 3 illustrates an amplifying circuit, comprising an analog amplifying circuit 310 and a feedback circuit 300. The analog amplifying circuit 310 may have an analog input 311 for receiving an analog input signal to be amplified and an analog output 312 for outputting an amplified analog signal. The amplifying circuit 310 may comprise an implementation 315 of a complex transfer function H(jω). The offset δ, illustrated tentatively at 318, represents the unwanted DC component. This offset δ represents all DC components that may cause a distortion of the amplified signal y. Such DC components may include the DC component of the analog input signal and the DC components generated by the analog amplifying circuit 310 itself. The position of the offset δ 318 in the drawing is only schematically. The offset may be included in the input signal x, so before the bias signal is added at 317, or it may be created by the amplifying circuit 315, 100. A combination of both offsets is also possible.

The feedback circuit 300 may have a feedback circuit input 313 and a feedback circuit output 314. The feedback circuit 300 may comprise an implementation 316 of a transfer function G(jω) that is an estimation of an inverse of at least an unwanted DC component of the complex transfer function of the analog amplifying circuit 310. This transfer function G(jω) is referred to hereinafter as an inverse transfer function. This implementation 316 may comprise analog electronics, for example. The feedback circuit input 313 may be arranged for receiving a signal that is based on the amplified analog signal of the analog amplifying circuit. For example, the feedback circuit input 313 is directly connected to the output 312 of the amplifying circuit 310. The analog circuit 310 may be arranged for receiving a bias signal that is based on the feedback circuit output 314. For example, the input 313 of the implementation 316 may be low-pass filtered. The output $-\hat{x}$ of the implementation 316 may optionally be integrated, and a result of the integration may be fed back to the amplifying circuit 310 as the bias signal. For example, the bias signal may be added to an input signal x by an adder 317.

The feedback circuit 300 may comprise an integrator 301 configured to integrate an output signal generated by the implementation 316 of the inverse transfer function. This inverse transfer function in turn generates its output signal based on the feedback circuit input 313. The integrator thus generates an integrated value. This integrated value may be provided as the bias signal. Alternatively, some more processing may be performed on the integrated value, such as amplification or de-amplification and/or low-pass filtering.

The circuit may comprise an adder 317 for adding the bias signal to the analog input signal. This way may help to remove an unwanted DC component of the analog input signal and/or an unwanted DC component generated by the amplifying circuit 310. These unwanted DC components are generally indicated in the drawing by offset δ 318.

Figure 8:
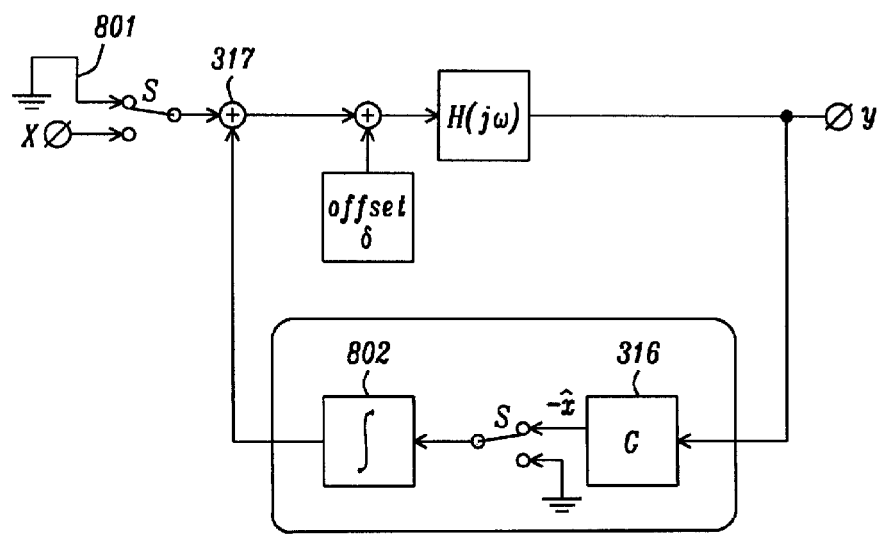
FIG. 8 is a diagram of an alternative DC offset compensation circuit depicted in capture mode.

The circuit may comprise at least one switch. In the example implementation shown in FIG. 3, there are two complementary switches S and $\overline{S}$. For example, switches S and $\overline{S}$ may be implemented as single throw switches. However, this is not a limitation. It is also possible for the skilled person, in view of the present disclosure, to build a similar system with, for example, two non-complementary switches. FIG. 8 shows a circuit that is similar to FIG. 3, except for the configuration of the switches. In FIG. 8, the switch S may be configured to connect the adder 317 with signal input x in one mode (corresponding to 'closed' position), and connect the adder 317 with ground 801 in the other mode (corresponding to 'open' position). The switch $\overline{S}$ may be configured to connect the implementation 316 with the integrator 301 in one mode (corresponding to 'closed' position), and connect the integrator 301 with ground 802 in the other mode (corresponding to 'open' position). For example, one of the switches may connect to ground at any given time. The skilled person is capable of configuring such switches in such a way that no complement signal need to be generated for operating the switches. However, this is not a limitation.

In either of FIG. 3 and FIG. 8, the switches may be configured to enable the circuit to operate in different modes. For example, a calibration mode (also referred to as capture mode herein) and an operating mode may be selected by means of the switches. In the calibration mode, for example a connection between the analog input 311 and an external signal source x is disconnected. As there is no actual input signal x in the calibration mode, because it is disconnected by the open switch S, any DC at the output of the amplifying circuit is then considered unwanted or distortion. This DC component is estimated by the implementation 316 and/or integrator 301. A value representing that DC component is stored to be used in operating mode. In the operating mode, the switch S may be closed to connect the input signal x with the amplifying circuit 310. Meanwhile, the bias signal is generated based on the stored value representing the DC component and added to the input signal x by means of adder 317, the result of the adder 317 may be provided to the amplifying circuit 310, to obtain an amplified signal y that does not suffer from any unwanted DC component (or at least has reduction of any unwanted DC component).

The analog amplifying circuit 310 may be configured to operate with increasing gain setting over time during the calibration mode. For example, at the beginning of a calibration mode, the gain setting is set to a low value, and the gain setting is gradually increased (continually or in steps), to arrive at a maximum gain setting. The DC components are thus already compensated to a large extent before the gain setting arrives to its maximum, hence avoiding large amplification to happen without DC compensation altogether.

In an embodiment, the analog circuit 310 comprises a heterodyne receiver configured to generate an intermediate frequency that is larger than 0 Hz and less than about 10 times a channel spacing of a received signal.

FIG. 3 shows a functional diagram of a circuit including a feedback circuit 300. The function H(jω) may represent any part of the amplifying circuit, such as an IF block (see e.g. first and second IF amplifiers 104, 106, or IF filter 105), or a combination of IF blocks in the system. Possibly, H(jω) comprises the complete cascade of IF blocks. For example, a DC component could be due to a static offset due to manufacturing tolerances of certain material used.

The connection x may be connected to an antenna, possibly via an LNA 102 and/or mixer 103, as discussed with reference to FIG. 1 prior art. However, the connection x may also be connected to another kind of signal source. The switch S, connected in series with input x, may be opened when the circuit is in a capture mode and closed when the circuit is in an operating mode. The switch $\overline{S}$ between block G and the integrator 301 may be closed during the DC estimation phase and open during the operating mode. Accordingly, these switches may be set mutually exclusive implying that when the capture mode is finished, both switches may flip their state, the input signal x may be applied to the circuit block including H(jω), and the integrator input may become zero, so that the integrator output remains constant. The circuit may be operated as follows.

In the capture mode, the input to the circuit block H(jω) is, as much as possible according to design considerations, only the constant offset (which may be considered a disturbance), indicated tentatively in the diagram by δ at 318. The output y of the circuit block H(jω) is substantially the offset (δ) multiplied by the DC transfer function of the block: $H_0 = H(j\omega)|_{\omega=0}$. So $y = H_0 \delta$.

The output y of the block H(jω) is provided to block G(jω) of the feedback circuit 300. This block G(jω) may be an estimate of the negative inverse of H(jω). If it is not the negative inverse, the feedback signal may be negated at another place in the feedback circuit 300 or adder 317. However, for the purpose of this description it is assumed that the block G(jω) is an estimate of the negative inverse of H(jω). Suppose the constant transfer function $G = -(1+\epsilon)H_0^{-1}$, then its output in the capture mode may be $-\hat{x} = -(1+\epsilon)\delta$. Here, $\epsilon$ ($\epsilon \ll 1$) represents an accuracy tolerance on the estimate of the DC transfer function $H_0$.

The output of the integrator may also be $-(1+\epsilon)\delta$, e.g. if it was initially set to zero. The output of the integrator may be added to the offset δ, so that the input to the circuit block H(jω) becomes $-\epsilon\delta$, i.e. the input referred offset is reduced according to the accuracy tolerance of the circuit estimate.

The output of the constant transfer function G may thereafter be $-\hat{x} = (1+\epsilon)\epsilon\delta$ and the integrator may adjust its output to $-(1-\epsilon^2)\delta$, making the error, in the correction signal reduce according to the square of the accuracy tolerance of the circuit estimate.

This convergence sequence may continue step by step, reducing the error on the feedback signal in an exponential fashion, until it meets a predetermined accuracy criterion. After n updates, the absolute value of the relative error is $\epsilon^n \times 100\%$.

When the sequence has converged, the capture mode may be terminated. The switches S and $\overline{S}$ can then flip state and the input signal x is added to the output of the integrator 301, the result thereof is processed by the circuit block $H(j\omega)$, which results in the output signal y that does not suffer from DC distortion. As the switch $\overline{S}$ is open, the integrator does not change its value any more.

Alternatively, the switch $\overline{S}$ may remain closed in operating mode, allowing the integrator value to be updated while processing the signal x. However, in this case, any AC component in the signal y should be filtered out before feeding the signal value from the circuit block $G(j\omega)$ to the integrator 301.

Figure 4:
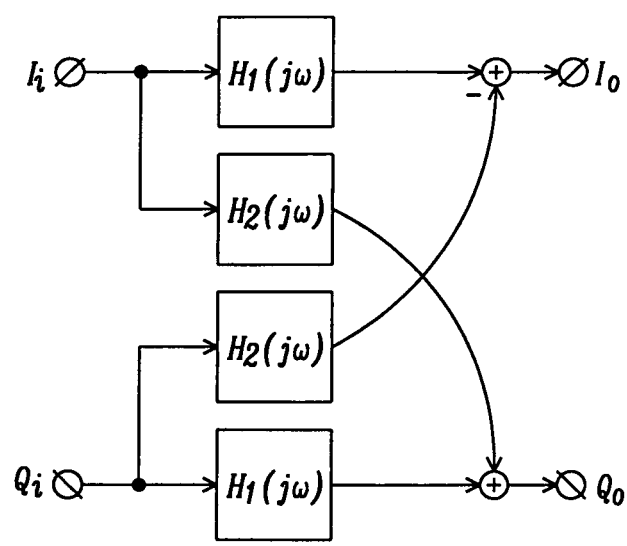
FIG. 4 is a diagram of a generic implementation of a complex transfer function.

It is noted, that in the case of a low-intermediate frequency (LIF) receiver, the circuit block $H(j\omega)$ is generally a complex function $H(j\omega)=H_1(j\omega)+jH_2(j\omega)$. FIG. 4 shows a generic system representation of the complex function $H(j\omega)$. Such a complex transfer function may also be represented by a matrix-vector notation, with $$x = \begin{pmatrix} I_i(j\omega) \\ Q_i(j\omega) \end{pmatrix};$$

$$y = \begin{pmatrix} I_o(j\omega) \\ Q_o(j\omega) \end{pmatrix};$$

$$H(j\omega) = \begin{pmatrix} h_1(j\omega) & -h_2(j\omega) \\ h_2(j\omega) & h_1(j\omega) \end{pmatrix}.$$

The DC component $H_0$ of such a complex transfer function may also be represented by a matrix-vector notation, with $$x = \begin{pmatrix} I_i \\ Q_i \end{pmatrix};$$

$$y = \begin{pmatrix} I_o \\ Q_o \end{pmatrix};$$

$$H_0 = \begin{pmatrix} h_1 & -h_2 \\ h_2 & h_1 \end{pmatrix}.$$

The DC transfer function $y=H_0 x$ can thus be represented by a matrix function $$\begin{pmatrix} I_o \\ Q_o \end{pmatrix} = \begin{pmatrix} h_1 & -h_2 \\ h_2 & h_1 \end{pmatrix} \begin{pmatrix} I_i \\ Q_i \end{pmatrix} \quad (1)$$

with constant values for $h_1$ and $h_2$, wherein both $h_1$ and $h_2$ may be nonzero. The estimation of the input signal x is denoted herein by $$\hat{x} = \begin{pmatrix} \hat{I}_i \\ \hat{Q}_i \end{pmatrix}.$$

The inverse function $-\hat{x}=Gy$ uses the negative inverse of the matrix $H_0$, with $G=-H_0^{-1}$, so that $$G = \begin{pmatrix} g_1 & -g_2 \\ g_2 & g_1 \end{pmatrix},$$

and $$\begin{pmatrix} \hat{I}_i \\ \hat{Q}_i \end{pmatrix} = \begin{pmatrix} g_1 & -g_2 \\ g_2 & g_1 \end{pmatrix} \begin{pmatrix} I_o \\ Q_o \end{pmatrix}, \quad (2)$$

in which $$g_1 = \frac{-h_1}{h_1^2 + h_2^2} \quad (3)$$

$$g_2 = \frac{h_2}{h_1^2 + h_2^2}.$$

The transfer function $H(j\omega)$ of the IF section is well known. Its principle time constant may be calibrated and all dependent time constants as well as the gains of the variable gain amplifiers (VGA's) may rely on the ratios of resistors. One or more of such VGA's may be part of the amplifying circuit 310. Consequently, the error factor $\epsilon_1$ and $\epsilon_2$ for $h_1$ and $h_2$, respectively may be reasonably small. Accordingly, the convergence of the offset compensation using the feedback circuit 300 can be acceptably fast.

Figure 5:
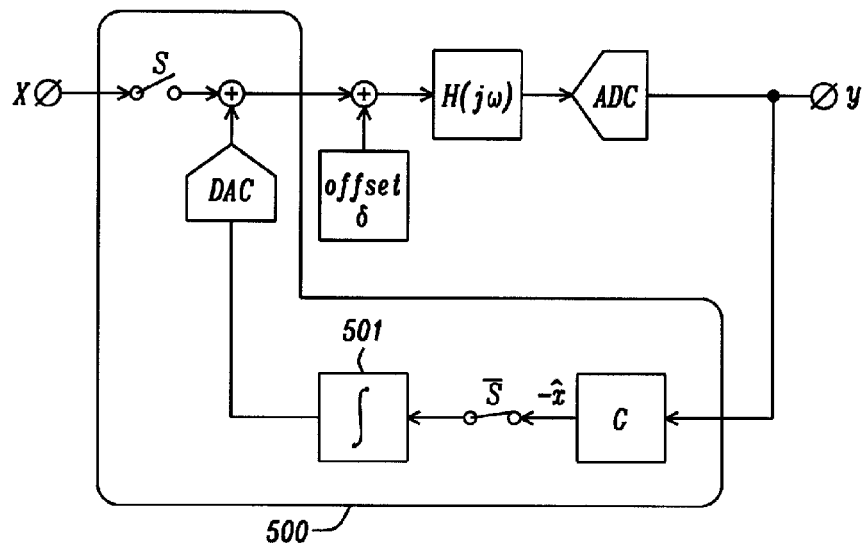
FIG. 5 is a diagram of a DC offset compensation circuit, with a digital feedback circuit.

FIG. 5 shows an embodiment in which the feedback circuit 500 is implemented in the digital domain. This way, the calculation and integration and storage of the calibrated value can be done in the digital domain. The circuit diagram of FIG. 5 is similar to that of FIG. 3, but an analog-to-digital converter (ADC) has been included, so that the output signal y is available in digital format to the feedback circuit 500, and a digital-to-analog converter (DAC) has been included, so that the digital output of the integrator 501 is first converted to an analog signal by the DAC, and added to the input signal x in the analog domain. In this diagram, the block $H(j\omega)$ represents analog electronics, whereas the block G and the integrator 501 represent digital signal processing blocks. For the purpose of the feedback circuit 500, the analog-to-digital-converter (ADC) should be connected in the path towards the constant transfer function G. It is not necessary that the output signal y be digitized before being used elsewhere. However, in the diagram of FIG. 5, the ADC is used for two purposes, namely to provide a digital output y and to provide a digital signal to the feedback circuit 500. For example, in a LIF receiver, the ADC may be part of the system with its output connected to an automatic gain control (AGC) sub-system and/or a digital demodulator.

Special provisions may be taken if the transfer function $H(j\omega)$ is variable. For example, the gain of the IF amplifiers may be varied continuously. In such a case, the values of $g_1$ and $g_2$ in Equations (2) and (3) should be changing accordingly. These values may be available from knowledge of the electronic block $H(j\omega)$, or may be determined by experimenting with different gain settings. However, if appropriate estimates are only available for a single gain setting, for example the highest gain setting, the error that is introduced by not changing the values of $g_1$ and $g_2$ may still be within the specification of tolerance.

For the purposes of a receiver system, a single feedback loop could compensate the DC offset along the entire cascade of first IF amplifier, the IF filter and the second IF amplifier. In other systems it might be possible that the uncontrolled nodes B, C and D from FIG. 1 prior art would bring the system on the brink of saturation, even though the offset at point E is within a desired range.

Figure 6:
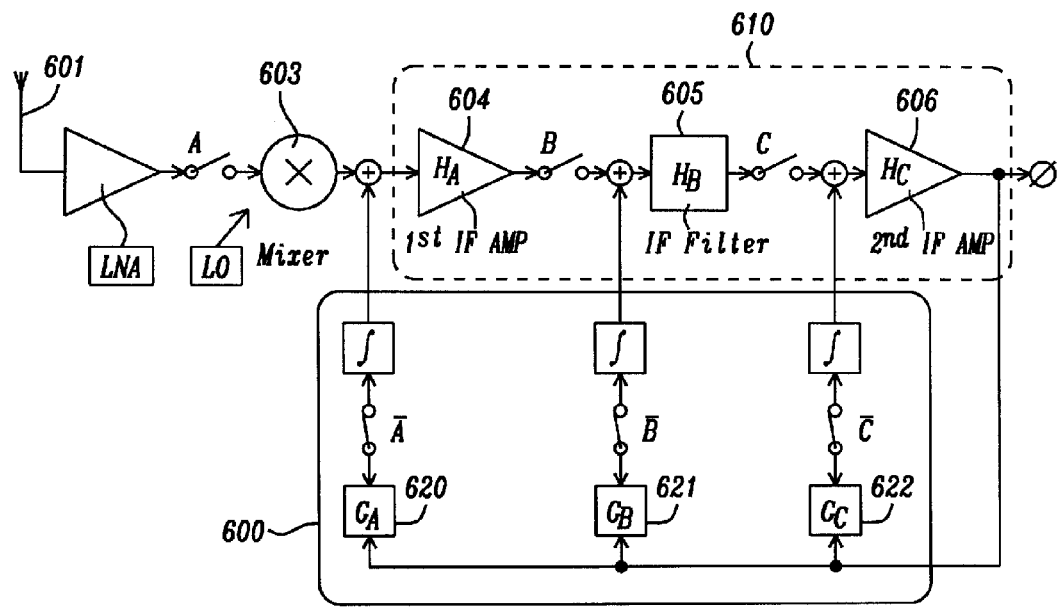
FIG. 6 is a diagram of a multiple loop DC offset compensation circuit.

FIG. 6 shows a diagram of a circuit that has more than one feedback loop in the feedback circuit 600. This circuit is based on the receiver path depicted in FIG. 1 prior art. However, a similar setup with multiple feedback loops may be provided in other applications.

The analog circuit 610 of FIG. 6 has a number of processing portions 604, 605, 606 connected in sequence. An output of the last portion in the sequence is connected to the feedback circuit 600, and the feedback circuit 600 is configured to provide separate bias signals to inputs of the different portions 604, 605, 606 of the sequence. There is a choice in how the analog amplifying circuit is divided into different portions that each receive a bias signal. FIG. 6 only shows an example of such a division.

The circuit may support several calibration modes, for example one calibration mode for each bias signal. Each calibration mode may be configured to set a number of switches in such a way that a different one of the separate bias signals may be calibrated. The sequential portions of the amplifying circuit starting with the portion receiving the bias signal and up to the portion providing the output signal y has a certain complex transfer function. The feedback circuit may comprise, for each calibration mode, an implementation 321 of an inverse transfer function that is an estimation of an inverse of at least a DC component of the complex transfer function realized by one or more sequential portions starting with a portion 605 that is configured to receive the separate bias signal corresponding to the calibration mode up to and including the portion 606 that provides the amplified analog signal to the feedback circuit 600.

In FIG. 6, in its open position, the switch A provided between the low noise amplifier (LNA) and the mixer 603 disables the antenna 601 input signal from reaching the input of the mixer 603. The local oscillator (LO) may be enabled and its possible cross-talk to the RF-port of the mixer 630 down-converted and visible at the output of the mixer 603 as a DC component. For example, the first IF amplifier 604 is assumed to have a transfer function $H_A$ and due to its construction it may feature an input referred offset voltage. The same may be true for the IF filter 605 ($H_B$) and the second IF amplifier 606 ($H_C$).

With the switches A, B and C open, the compensation function $G_C$ (block 622) may be used to calibrate the offset of the second IF amplifier 606. Once this loop is calibrated, the switch C may be closed and the cascade of $H_B H_C$ may be calibrated using the compensation function $G_B$. After this, the switch B may be closed and the cascade $H_A H_B H_C$ may be calibrated using the third loop with function $G_A$. After all 3 paths are compensated, finally the switch A may be closed and the receiver may be enabled to receive the desired RF signal. Switches $\overline{A}$, $\overline{B}$, and $\overline{C}$ may be switched complementary to switches A, B, and C, respectively.

Note that the combination of the mixer 603 and first IF amplifier 604 is compensated together. Since the mixer 603 transfers the input spectrum at its RF port to another portion of the spectrum, a compensation signal at its input would have to be supplied at the LO frequency to have a noticeable effect at DC at its output.

Figure 7:
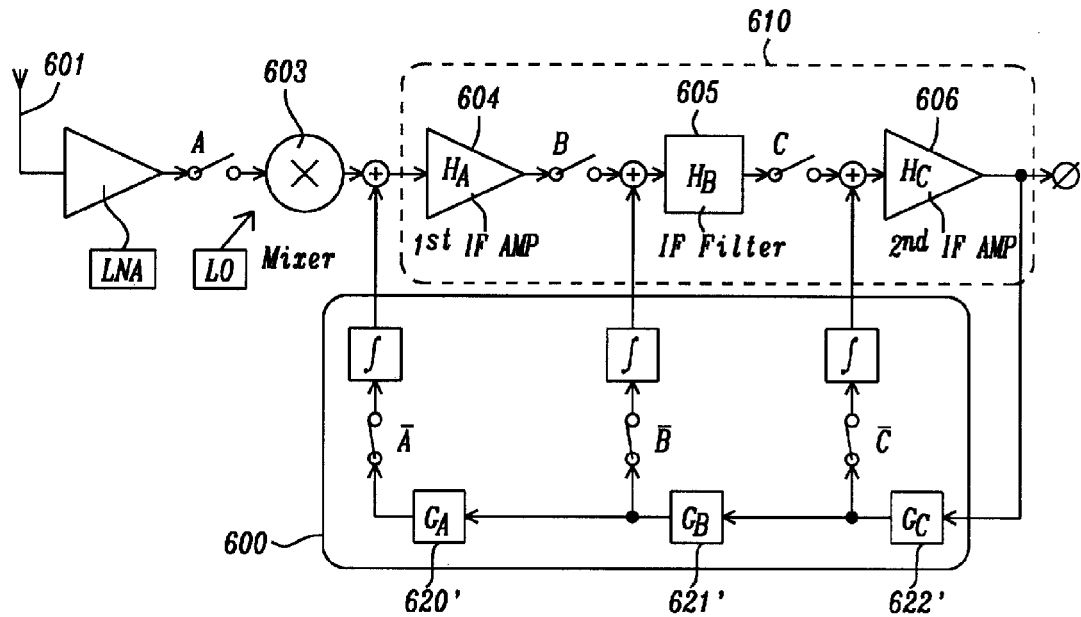
FIG. 7 shows another configuration of a multiple loop DC offset compensation circuit.

FIG. 7 shows an alternative implementation of the circuit of FIG. 6. However, the compensation functions 622, 621', 620' in the feedback circuit of FIG. 7 are arranged in sequence, whereas in FIG. 6, the compensation functions 622, 621, 620 are arranged in parallel. In the circuit of FIG. 7, $G_B$ 621' is configured to act on the output of $G_C$ 622, and $G_A$ 620' is configured to act on the output of $G_B$ 621'. For the rest, the circuit of FIG. 7 corresponds to the circuit of FIG. 6. In the arrangement of FIG. 7, for example, $G_C=-H_C^{-1}$, $G_B=H_B^{-1}$, and $G_A=H_A^{-1}$. Note, that only one time a negation is performed, but it does not necessarily have to be performed by $G_C$. This would simplify the implementation of the feedback circuit compared to FIG. 6.

Using the complex inverse of H, a compensation of a complex transfer function becomes possible. Although this complex nature of the inverse may make the feedback loop more complex, it provides a better result. The estimate of the DC transfer function of the IF section does not have to be very accurate. The system may converge more slowly in the capture mode if the estimate is not so accurate. Variable gain in the IF section can be made to change in a deterministic way which allows appropriate updates of the G function yielding a stable system independent of gain setting.

In a practical implementation of a compensation system, the following steps may be taken: First, the desired input signal may be switched off. Then, the DC offset may be compensated in a low gain setting for $H(j\omega)$. After that, the DC offset may be compensated in increasing gain settings, until the highest gain setting for $H(j\omega)$ is reached. After convergence of the compensation value, the compensation values may be fixed and the normal signal path may be enabled. The compensation value may then be provided as a constant value, without further feedback loop.

Residual offset at the output, due to finite resolution of the digital compensation system, can be compensated at the end of the cycle by a dedicated offset compensation mechanism in the ADC's and/or in the digital domain.

During normal reception the system does not need to be slowed down or made instable by one or more additional (dominant) poles.

In case of a digital implementation of the feedback circuit 500, 600, the compensation values can be stored in a look-up-table (LUT). For example, different compensation values may be stored associated with different gain stettings of the amplifier circuit. In another example, different compensation values may be associated with different RF channels. This can be helpful to save time prior to reception of data. Since part of the input referred offset (and thus the compensation value) may be dependent on the selected RF channel.

This system can also be used for zero-intermediate-frequency (ZIF) systems, by making the values of $h_2=0$ and $g_2=0$.

Some or all aspects of the invention, for example the digital feedback circuit 600, may be suitable for being implemented in form of software, in particular a computer program product. Such computer program product may comprise a storage media on which the software is stored. Such a storage media may comprise, for example, an optical disc, magnetic disk, or flash memory. Also, the computer program may be represented by a signal, such as an optic signal or an electromagnetic signal, carried by a transmission medium such as an optic fiber cable or the air. The computer program may partly or entirely have the form of source code, object code, or pseudo code, suitable for being executed by a computer system. For example, the code may be directly executable by one or more processors. Alternatively, the code may be interpreted by an interpreter that is executed by one or more processors. It will be understood that portions of the systems described herein may be implemented in form of software.

Moreover, the method steps described herein may be implemented partially or completely in software. The software may be organized by means of subroutines. The subroutines may be combined to form a standalone executable program. Alternatively, the subroutines may be organized as a dynamically linkable library. A main program executable file may be provided that uses the subroutines from the dynamically linkable library. Each of the processing steps and/or system components described herein may be represented by executable code, be it in a dynamically linked library or in an executable file. Some, or all, of the functionality may be implemented as part of an operating system, some functionality may be implemented in a dynamically linked library, and some functionality may be implemented as an application program file.

FIG. 9 illustrates a flowchart of a method disclosed to provide an improved offset compensation for an amplifier circuit. The first step 90 describes providing an amplifier circuit comprising an analog amplifying circuit, having an analog input for receiving an analog input signal to be amplified, wherein the analog input may have a DC component, and an analog output for outputting an amplified analog signal, and a feedback circuit arranged for receiving a signal that is based on the amplified analog signal of the analog amplifying circuit and providing a bias signal, based on a feedback circuit output, to the input of the analog amplifying circuit. The following step 91 depicts implementing a complex transfer function in the analog amplifying circuit, wherein the analog output of the analog amplifying circuit may have a DC component. The next step 92 shows implementing an inverse transfer function in the feedback circuit, wherein the inverse transfer function is correcting the DC component that may be present in the analog input by estimating an inverse of at least a DC component of the complex transfer function of the analog amplifying circuit. The last step 93 of the method disclosed illustrates adding the bias signal to the analog input signal to compensate the DC component of the analog input signal.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

The invention claimed is:

1. An amplifying circuit, comprising
an analog amplifying circuit having an analog input for receiving an analog input signal to be amplified and an analog output for outputting an amplified analog signal, wherein the amplifying circuit comprises an implementation of a complex transfer function; and
a feedback circuit having a feedback circuit input and a feedback circuit output, wherein the feedback circuit comprises an implementation of an inverse transfer function that is an estimation of a complex inverse of at least a DC component of the complex transfer function of the analog amplifying circuit; wherein
the feedback circuit input is arranged for receiving a signal that is based on the amplified analog signal of the analog amplifying circuit; and
the analog circuit is arranged for receiving a bias signal that is based on the feedback circuit output.

2. The circuit of claim 1, wherein the feedback circuit comprises an integrator for integrating an output of the implementation of the inverse transfer function based on the feedback circuit input to obtain an integrated value, and wherein the bias signal depends on the integrated value.

3. The circuit of claim 1, comprising an adder for adding the bias signal to the analog input signal, to remove a DC component of the analog input signal.

4. The circuit of claim 2, comprising at least one switch to enable the circuit to operate in at least a calibration mode and an operating mode, wherein, in the calibration mode, a connection between the analog input and an external signal source is disconnected, and the DC component of the analog input signal is estimated by the integrator, and a value representing that DC component is stored, and, in the operating mode, the bias signal is generated based on the stored value representing the DC component.

5. The circuit of claim 4, wherein the analog amplifying circuit is configured to operate with increasing gain setting over time during the calibration mode.

6. The circuit of claim 1, wherein the analog circuit has a number of processing portions connected in sequence, wherein an output of the last portion in the sequence is configured to provide the amplified analog signal to the feedback circuit, and the feedback circuit is configured to provide separate bias signals to inputs of at least two different portions of the sequence.

7. The circuit of claim 6, wherein the circuit is arranged to operate in at least two different calibration modes, wherein each calibration mode is provided for calibrating a different one of the separate bias signals, and wherein the feedback circuit comprises, for each calibration mode, an implementation of an inverse transfer function that is an estimation of an inverse of at least a DC component of the complex transfer function realized by one or more sequential portions starting with a portion that is configured to receive the separate bias signal corresponding to the calibration mode up to and including the portion that provides the amplified analog signal to the feedback circuit.

8. The circuit of claim 1, wherein the analog circuit comprises at least one intermediate frequency amplifier and an intermediate frequency filter.

9. The circuit of claim 8, wherein the analog circuit comprises a heterodyne receiver configured to generate an intermediate frequency that is larger than 0 Hz and less than about 10 times a channel spacing of a received signal.

10. The circuit of claim 1, wherein the feedback circuit comprises a digital circuit.

11. A method to achieve offset compensation for an amplifier circuit, comprising the following steps:
providing an amplifier circuit comprising an analog amplifying circuit, having an analog input for receiving an analog input signal to be amplified, wherein the analog input may have a DC component, and an analog output for outputting an amplified analog signal, and a feedback circuit arranged for receiving a signal that is based on the amplified analog signal of the analog amplifying circuit and providing a bias signal, based on a feedback circuit output, to the input of the analog amplifying circuit;
implementing a complex transfer function in the analog amplifying circuit, wherein the analog output of the analog amplifying circuit may have a DC component;
implementing an inverse transfer function in the feedback circuit, wherein the inverse transfer function is correcting the DC component that may be present in the analog input by estimating a complex inverse of at least a DC component of the complex transfer function of the analog amplifying circuit; and
adding the bias signal to the analog input signal to compensate the DC component of the analog input signal.

12. The method of claim 11, wherein the feedback circuit comprises an integrator for determining the DC component of an output of the implementation of the inverse transfer function based on the feedback circuit input, wherein the bias signal is correlated with the DC component.

13. The method of claim 12, wherein by using the integrator, the bias signal converges to a fixed value in which the DC component effectively is compensated.

14. The method of claim 12, wherein the amplifier circuit is configered to operate in a calibration mode and in an operating mode wherein, in the calibration mode, a connection between the analog input and an external signal source is disconnected, and the DC component of the analog input signal is estimated by the integrator, and a value representing that DC component is stored, and, in the operating mode, the bias signal is generated based on the stored value representing the DC component.

15. The method of claim 14, wherein the analog amplifying circuit is configured to operate with increasing gain setting over time during the calibration mode, wherein different settings of the value representing the DC component are determined and stored for different gain settings.

16. The method of claim 15, wherein the calibration mode is split into two or more periods, with increasing gain settings for the amplifier circuit.

17. The method of claim 11, wherein the analog amplifying circuit has a number of processing portions connected in sequence wherein an output of a last portion in the sequence is configured to provide the amplified analog signal to the feedback circuit, and the feedback circuit is configured to provide separate feedback DC signals to inputs of at least two different portions of the sequence thus allowing more sophisticated DC compensation by providing bias signals at different stages of the analog amplifying circuit.

18. The method of claim 17, wherein the amplifier circuit is arranged to operate in at least two different calibration modes and an operating mode wherein each calibration mode is associated with a respective inverse transfer function estimating an inverse of at least a DC component of the complex transfer function realized by one or more sequential portions up to and including the portion in the sequence that provides the amplified analog signal to the feedback circuit, wherein the bias signal is provided to the first portion of the one or more sequential portions this allowing to determine, with a single signal being input to the feedback circuit, a plurality of bias signals to be applied to different portions of the analog amplifying circuit, based on a plurality of respective inverse transfer functions.

19. The method of claim 11, wherein the analog circuit comprises at least one intermediate frequency amplifier and an intermediate frequency filter.

20. The method of claim 19, wherein the intermediate frequency is a low intermediate frequency.

21. The method of claim 11, wherein the analog amplifying circuit comprises a heterodyne receiver configured to generate an intermediate frequency that is larger than 0 Hz and less than about 10 times a channel spacing of a received signal.

22. The method of claim 11, wherein the feedback circuit comprises a digital circuit.

23. The method of claim 22, wherein the feedback circuit is completely digital except for at least one analog-to-digital converter and at least one digital-to-analog converter.

24. The method of claim 23, wherein the digital feedback circuit is implemented in form of software, in particular a computer program.

\* \* \* \* \*